United States Patent [19]

Lutz et al.

[11] Patent Number: 4,661,432
[45] Date of Patent: Apr. 28, 1987

[54] LIGHT-SENSITIVE, DIAZONIUM GROUP-CONTAINING POLYCONDENSATION PRODUCT, PROCESS FOR ITS PRODUCTION, AND LIGHT-SENSITIVE RECORDING MATERIAL CONTAINING THIS POLYCONDENSATION PRODUCT

[75] Inventors: Walter Lutz, Hochheim; Hartmut Steppan, Wiesbaden-Dotzheim, both of Fed. Rep. of Germany

[73] Assignee: Hoechst Aktiengesellschaft, Frankfurt am Main, Fed. Rep. of Germany

[21] Appl. No.: 824,257

[22] Filed: Jan. 23, 1986

Related U.S. Application Data

[63] Continuation of Ser. No. 593,091, Mar. 26, 1984, abandoned.

[30] Foreign Application Priority Data

Mar. 29, 1983 [DE] Fed. Rep. of Germany ....... 3311435

[51] Int. Cl.$^4$ .................. G03C 1/54; C07C 113/04
[52] U.S. Cl. .................... 430/175; 430/141; 430/157; 430/171; 430/175; 430/176; 430/302; 430/308; 430/311; 430/325; 534/558; 534/561; 534/564; 534/565
[58] Field of Search .............. 430/175, 171, 141, 157, 430/320; 204/159.11, 159.21

[56] References Cited

U.S. PATENT DOCUMENTS 3,679,419  7/1972  Gillich ................................. 430/175
3,849,392  11/1974  Steppan ............................. 430/175
3,867,147  2/1975  Teuscher ........................... 430/175
4,436,804  3/1984  Walls ................................. 430/175

Primary Examiner—Charles L. Bowers, Jr.
Attorney, Agent, or Firm—Schwartz, Jeffery, Schwaab, Mack, Blumenthal & Evans

[57] ABSTRACT

A light-sensitive, diazonium group-containing polycondensation product is described which comprises
(a) an optionally substituted diphenylamine-dianzonium salt I.
(b) a compound corresponding to the formula II $$R^4-O-CH_2-R^5 \qquad (II)$$

wherein
$R^4$ is H, alkyl or acyl, and
$R^5$ is an optionally substituted aromatic radical, and
(c) a compound corresponding to the formula III $$R^6-O-CH_2-R^8-CH_2-O-R^7 \qquad (III)$$

wherein
$R^6$ and $R^7$ are H, alkyl, or acyl and
$R^8$ is the radical of a compound selected from the group consisting of aromatic hydrocarbons, phenols, phenolethers, aromatic thioethers, aromatic heterocyclic compounds, and organic acid amides, with the radicals resulting from compound II being directing linked to the units of the diazonium salt I.

In the production of the polycondensation product, I is first condensed with II and then with III. The product is suitable for use as a light-sensitive substance in recording materials, particularly in printing plates, and yields light-hardening products which have an increased oleophilicity.

10 Claims, No Drawings

LIGHT-SENSITIVE, DIAZONIUM GROUP-CONTAINING POLYCONDENSATION PRODUCT, PROCESS FOR ITS PRODUCTION, AND LIGHT-SENSITIVE RECORDING MATERIAL CONTAINING THIS POLYCONDENSATION PRODUCT

This is a continuation of application Ser. No. 593,091, filed Mar. 26, 1984, now abandoned.

BACKGROUND OF THE INVENTION

The present invention relates to novel light-sensitive polycondensation products of aromatic diazonium salts, which products are produced according to a new condensation process, and also to light-sensitive recording materials which contain the specified polycondensation products in their recording layers.

It is known to produce polycondensation products by reacting aromatic diazonium salts, particularly diphenylamine-4-diazonium salts, with active carbonyl compounds, preferably formaldehyde. Condensation products of this type are described in U.S. Pat. No. 2,063,631. Their uses are described, e.g., in U.S. Pat. No. 3,235,383.

Such condensation products are used on a large scale in the production of printing forms. For this purpose, products for the condensation of which formaldehyde is used as the carbonyl compound having gained practically exclusive acceptance.

Although formaldehyde condensation products are still produced and used on a large scale, they have the disadvantage that their composition and properties can only be varied to a limited degree. When these products are used for the production of planographic printing forms, the oleophilic character of their light-hardening products is normally not sufficient in itself. The developed image stencil is therefore frequently reinforced by coating the stencil with a solution of an oleophilic resin. Such resins may also be admixed into the image layer from the start, but it is then generally necessary to add organic solvents to the developer.

In more recent times, the problem of variability has been solved by producing mixed condensation products, in the production of which, in addition to a carbonyl compound and a diazonium salt, a second component is employed which is condensable with formaldehyde.

These products and their uses are described in U.S. Pat. No. 3,867,147. They can advantageously also be produced by condensing the diazonium salt with a second component which carries reactive methylol groups or the esters or ethers thereof, the reactive groups being introduced, in the simplest case, by reacting the second component with formaldehyde. These condensation products yield high-quality radiation-sensitive materials, in particular printing plates, and are used on a large industrial scale.

It is, however, a disadvantage of these condensation products that in the exposure of binder-free layers comprising preferred representatives of these condensates, not all of the diazonium groups are decomposed. As a result, oleophilicity is reduced. Under the action of light, the undecomposed diazonium groups may, moreover, react with the hydrophilic polymer used for preservation, to form ink-repellent reaction products.

It is true that by increasing the amount of oleophilic second component in the condensation product, condensates are obtained which are to a higher degree oleophilic, but developing these condensates is more difficult and they are less suitable for storage than the normally preferred representatives.

In column 8, lines 32 to 42 of the aforementioned U.S. patent, another possibility of variation in the preparation of the condensation products is mentioned, comprising the condensing of monofunctional and bi- or polyfunctional second components with the diazonium salt, thus limiting the molecular weight of the polycondensation products. A monofunctional second component is only used in Example 23 and is there combined with formaldehyde.

In European Published Patent Application 61,150, a highly light-sensitive and oleophilic condensation product is obtained by condensing the second component with itself and then reacting it with a monomeric diazonium compound. In the light-sensitive layer, this condensation product is, however, also less suitable for storage and is more difficult to develop.

SUMMARY OF THE INVENTION

It is therefore an object of the present invention to provide novel polycondensation products prepared from aromatic diazonium salts and second components which are condensable therewith, which have substantially all advantages of the known condensation products, for example, sensitivity to light, storability and developability, and additionally yield light-hardening products of an improved oleophilic character.

In accomplishing the foregoing objects, a light-sensitive, diazonium group-containing polycondensation product is provided, which product is obtained in accordance with the present invention by condensation of (a) a diazonium salt corresponding to formula I

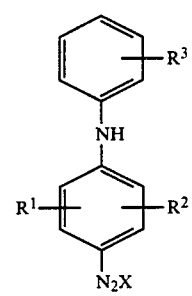

wherein
$R^1$, $R^2$ and $R^3$ each denote separately a hydrogen atom, a halogen atom, an alkyl group having from 1 to 3 carbon atoms, or an alkoxy group having from 1 to 6 carbon atoms, and X denotes the anion of the diazonium salt;

(b) a compound corresponding to formula II

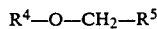

wherein
$R^4$ denotes a hydrogen atom, an alkyl group or an aliphatic acyl radical and
$R^5$ denotes a mononuclear or polynuclear aromatic radical, which is unsubstituted or is substituted by at least one halogen atom, alkyl group, halogenated alkyl group, alkoxy group having from 1 to 3 carbon atoms, carboxy group, aryl group, arylmercapto group, or aryloxy group, and (c) a compound corresponding to formula III $$R^6-O-CH_2-R^8-CH_2-O-R^7 \qquad (III)$$

wherein
$R^6$ and $R^7$ each denote separately a hydrogen atom, an alkyl group, or an aliphatic acyl radical, and
$R^8$ denotes the radical of a compound selected from the group consisting of aromatic hydrocarbons, phenols, phenolethers, aromatic thioethers, aromatic heterocyclic compounds, and organic acid amides
with the radicals resulting from compound II being directly linked to the units of the diazonium salt I.

It is a further object of the present invention to provide a method for synthesizing a novel diazonium-salt polycondensation product which displays excellent light-sensitivity as well as superior stability and enhanced oleophilicity.

In accomplishing this object, a process is provided in accordance with the present invention for the production of a light-sensitive diazonium-salt polycondensation product having the above-defined composition, wherein a diazonium salt corresponding to formula I

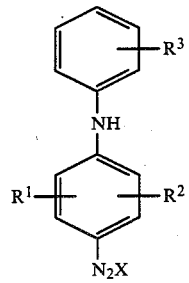
(I)

wherein
$R^1$, $R^2$ and $R^3$ each denote separately a hydrogen atom, a halogen atom, an alkyl group having from 1 to 3 carbon atoms, or an alkoxy group having from 1 to 6 carbon atoms, and
X denotes the anion of the diazonium salt,
is condensated in a strongly acid medium, first with a compound corresponding to formula II $$R^4-O-CH_2-R^5 \qquad (II)$$

wherein
$R^4$ denotes a hydrogen atom, an alkyl group or an aliphatic acyl radical and
$R^5$ denotes a mononuclear or polynuclear aromatic radical, which is unsubstituted or is substituted by at least one halogen atom, alkyl group, halogenated alkyl group, alkoxy group having from 1 to 3 carbon atoms, carboxy group, aryl group, arylmercapto group, or aryloxy group, and
and thereafter with a compound corresponding to formula III $$R^6-O-CH_2-R^8-CH_2-O-R^7 \qquad (III)$$

wherein
$R^6$ and $R^7$ each denote separately a hydrogen atom, an alkyl group, or an aliphatic acyl radical, and
$R^8$ denotes the radical of a compound selected from the group consisting of aromatic hydrocarbons, phenols, phenolethers, aromatic thioethers, aromatic heterocyclic compounds, and organic acid amides There is also provided in accordance with the present invention a light-sensitive recording material comprising a support and a light-sensitive layer which contains a light-sensitive diazonium-salt polycondensation product as described above.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DESCRIPTION OF PREFERRED EMBODIMENTS

Examples of basic structures, from which the condensable compounds II and III, which are used in the present invention, are derived include benzene, biphenyl, diphenylether, diphenylsulfide, diphenylmethane, naphthalene, anthracene, thiophene, urea, oxalic acid amide, and succinic acid amide. The aromatic basic structures may carry further substituents, for example, alkyl, alkoxy, or hydroxy groups.

The above enumeration includes the most important groups of substances which may comprise the radicals $R^5$ and $R^8$. Other possibilities are mentioned in U.S. Pat. No. 3,867,147 and in Houben-Weyl, *Methoden der organischen Chemie* ("Methods of Orgaic Chemistry"), 4th edition, vol. 14/2, pages 193–402, "Polyaddition or condensation products of carbonyl and thiocarbonyl compounds," the contents of which are hereby incorporated by reference.

In the preparation of the condensation products according to the present invention, the two condensation reactions may be run successively in the same condensation medium, under relatively mild conditions, which are also conventionally used in the known preparation of mixed condensation products. In the process, adherence to the indicated sequence of condensation steps is essential. It is, however, not necessary to isolate the product obtained in the first condensation step, i.e. the two reactions may be carried out in a "one-pot process".

Consequently, it is necessary to effect, in a first step, the reaction of the diazonium salt I with the monofunctional compound II and only thereafter the reaction with the bifunctional compound III. Only these reaction conditions ensure that crude condensates result which dissolve in water to form clear solutions. As compound II, the following compounds or their etherification products with short-chain alcohols or their esterification products with short-chain aliphatic carboxylic acids may be used:

Benzyl alcohol, 4-methyl-benzyl alcohol, 4-isopropylbenzyl alcohol, 4-methoxy-benzyl alcohol, 4-carboxy-benzyl alcohol, 4-phenyl-benzyl alcohol, 4-phenoxy-benzyl alcohol, 4-p-tolyloxy-benzyl alcohol, 4-o-tolyloxy-benzyl alcohol, 4-chlorophenoxy-benzyl alcohol, benzohydrol, 4-phenylmercapto-benzyl alcohol; 4-fluoro-benzyl alcohol, 3-fluoro-benzyl alcohol, 2-fluoro-benzyl alcohol, 4-chloro-benzyl alcohol, 3-chloro-benzyl alcohol, 2-chloro-benzyl alcohol and 2-fluoro-6-chloro-benzyl alcohol; 2-hydroxymethyl-naphthalene, 4-hydroxymethyl-thiophene, 1-hydroxymethyl-diphenyleneoxide, N-hydroxymethylbenzoic acid amide, N-hydroxymethylurea, and 2-hydroxy-hyxdrdoxymethyl-benzene.

In the preferred compounds II, $R^5$ is a phenyl radical which is optionally substituted by halogen atoms, alkyl groups, halogenoalkyl groups, alkoxy groups having from 1 to 3 carbon atoms, phenyl, tolyl, phenylmercapto, phenoxy or tolyloxy groups.

Of these, those compounds are preferred, which (if they are substituted) have the substituent in the p-position.

The hydroxymethyl, methoxymethyl, and acetoxymethyl groups have a comparable reactivity in the acid condensation medium.

Useful diphenylamine-4-diazonium salts include compounds which may or may not have been substituted in ways known in the art. The diphenylamine-4-diazonium salts which have not been substituted or which have been substituted by an alkyl or, especially, an alkoxy group having from 1 to 3 carbon atoms, are preferred. Compounds in which the alkyl or alkoxy group is in the 3-position are especially advantageous. Examples of suitable diazonium compounds include those derived from the following amines:

4-amino-3-methoxy-diphenylamine, 4-amino-diphenylamine, 4'-amino-2-methoxy-diphenylamine, 4'-amino-4-methoxy-diphenylamine, 4-amino-3-methyl-diphenylamine, 4-amino-3-ethyl-diphenylamine, 4'-amino-4-methyl-diphenylamine, 4-amino-3-hexyloxy-diphenylamine, 4-amino-3-ethoxy-diphenylamine, 4'-amino-2-methoxy-5-methyl-diphenylamine, 4'-amino-3,3'-dimethyl-diphenylamine, 3'-chloro-4-amino-diphenylamine, 4'-amino-4-n-butoxy-diphenylamine, 4'-amino-3',4-dimethoxy-diphenylamine, and 4'-bromo-4-amino-diphenylamine.

4-amino-diphenylamine and 3-methyl-4-amino-diphenylamine are preferred. 3-methoxy-4-amino-diphenylamine is particularly preferred. Hydrogen sulfate is preferably used as the anion of the diazonium salt. The reaction takes place in a strongly acid medium.

Suitable condensation agents include phoshoric acid, methanesulfonic acid and sulfuric acid, which agents are used in concentrations of at least 40, preferably 70 to 100, percent by weight. The rest, in general, is water, but it may also be partly or completely composed of organic solvents, e.g., methanol, acetic acid, N-methyl pyrrolidone, and the like. Good results are achieved, for example, by using 85 to 93 percent strength phosphoric acid, 80 percent strength sulfuric acid or 90 percent strength methanesulfonic acid or mixtures of these acids.

Eighty to 100 percent strength, in particular 85 to 93 percent strength phosphoric acid is a rather mild condensation agent in which the condensation reaction can be conducted very gently. It is, therefore, the preferred condensation agent for all combinations of compounds which react fast enough under these rather gentle conditions.

Eigthy to 100 percent strength, in particular 90 percent strength methanesulfonic acid, is a stronger agent.

The process is preferably carried out in such a way that, on the one hand, as little acid as possible is used, but, on the other hand, a condensation mixture is obtained which can easily be stirred and mixed. When the type and quantity of the acid to be used are determined, the ability of the components to undergo condensation reactions and their solubility in the acid should be condisered.

In general, condensation is carried out at temperatures from about 0° to about 70° C., preferably from 10° to 50° C.

The novel polycondensation products are generally separated in the form of a salt and, after the addition of the other desired layer components, used for preparing the coating solution in this form.

The polycondensation products can, for example, be separated and used as salts of the following acids:

Halogen hydracids, such as hydrofluoric acid, hydrochloric acid, hydrobromic acid; sulfuric acid, nitric acid, phosphoric acids (pentavalent phosphorus), in particular orthophosphoric acid, inorganic iso- and heteropolyacids, e.g., phosphotungstic acid, phosphomolybdic acid, aliphatic or aromatic phosphonic acids or the half-esters thereof, arsonic acids, phosphinic acids, trifluoroacetic acid, amidosulfonic acid, selenic acid, hydrofluoboric acid, hexafluorophosphoric acid, perchloric acid; aliphatic and aromatic sulfonic acids, e.g., methanesulfonic acid, benzenesulfonic acid, toluenesulfonic acid, mesitylenesulfonic acid, p-chlorobenzenesulfonic acid, 2,5-dichlorobenzenesulfonic acid, sulfosalicylic acid, naphthalene-1-sulfonic acid, naphthalene-2-sulfonic acid, 2,6-di-tert.-butyl-naphthalenedisulfonic acid, 1,8-dinitro-naphthalene-3,6-disulfonic acid, 4,4'-diazidostilbene-3,3'-disulfonic acid, 1,2-naphthoquinone-2-diazide-4-sulfonic acid, 1,2-naphthoquinone-2-diazide-5-sulfonic acid, and 1,2-naphthoquinone-1-diazide-4-sulfonic acid.

Other organic sulfonic acids which can be used for separating the condensates are listed in columns 2 through 5 of U.S. Pat. No. 3,219,447, the contents of which are incorporated by reference.

Mesitylenesulfonic acid, naphthalene-2-sulfonic acid, and methanesulfonic acid are particularly preferred.

For the preparation of the diazo-polycondensates, from 0.1 to 1.5 moles of compound II and from 0.5 to 1.5 moles of compound III are usually employed, per mole of diazonium salt. The preferred amounts are from 0.5 to 1.2 moles of II and from 0.8 to 1.3 moles of III, per mole of diazonium salt.

In general, about 0.4 to 3, preferably 0.8 to 2 moles, of second components (II+III) are used, per mole of diazonium salt I. The molar ratio II:III should be in the range from about 0.2 to 2:1, preferably from 0.6 to 1.2:1.

In printing layers, diazo-polycondensates in which compound II is present at a lower concentration have the same sensitivity to light, but exhibit an inferior ink receptivity upon proof printing.

In addition, condensates which contain up to 1.3 moles of compound II and more than 1.5 moles of compound III, per 1 mole of diazonium salt, have a reduced storability in the light-sensitive layer.

One of the many advantages of the condensates produced in accordance with the process of the invention is that they can easily be separated in the form of salts which do not contain complex-forming metal salts. For example, many condensates give sulfates, chlorides, and bromides which are sparingly soluble in water and can easily be precipitated from aqueous solutions of the condensation mixtures by addition of the corresponding acids or water-soluble salts thereof. A more detailed description of the separation process will be given in the following Examples.

The polycondensation products of this invention are distinguished from the known diazonium-salt polycondensation products by a number of advantages. Compared with the former condensation products of formaldehyde and diazonium salt, they are easier to separate from the condensation medium and thus to isolate in a pure form. Light-sensitive recording materials, particularly printing plates, produced with the novel polycondensation products are less sensitive to fingerprints and generally exhibit a higher sensitivity to light.

These properties are similar to those of the mixed condensation products described in U.S. Pat. No. 3,867,147. Compared with these high-quality products, the products of the invention have the advantage that they have a more strongly pronounced binder character. This results in a hgher oleophilicity, which is reflected in an improved ink receptivity.

In an attempt to attain this property of the condensate by increasing the amounts of the second components comprising at least two reactive groups, which are described in U.S. Pat. No. 3,867,147, relative to the amount of the diazonium salt groups used, products are obtained which yield layers of reduced storability.

Crude condensates which contain a considerable amount of water-insoluble condensate are obtained, if the two condensable compounds II and III are simultaneously added to the diazonium compound which is already present in the condensation medium.

Similarly, the crude condensates contain a high proportion of water-insoluble constituents, if diazonium compound I is first reacted with compound III and condensation with compound II is effected in a second step.

For the production of copying materials, the diazonium-salt polycondensation products are dissolved in an appropriate solvent, either alone or together with other layer components, and the resulting solution is coated onto the selected support. The supports used for producing offset-printing plates are preferably made of metallic materials, particularly aluminum. Prior to the coating step, aluminum is generally roughened by mechanical or electrochemical means, optionally subjected to an anodic oxidation process and optionally treated with a solution of silicates, certain complex salts, phosphonic acids, or other known agents.

The light-sensitive layer is dried at room temperature or at elevated temperatures.

Various other substances may additionally be contained in the copying layers as further components. Examples of such additional layer ingredients include:

Acids, such as phosphoric acid (in particular orthophosphoric acid), phosphonic acids, and phosphinic acids; the strong acids mentioned in U.S. Pat. No. 3,235,382, such as sulfuric acid or organic sulfonic acids, e.g., toluenesulfonic acid; organic polyacids, e.g., polyvinylphosphonic acid.

Water-soluble polymers, such as polyvinyl alcohol, partly saponified polyvinyl acetate (acetyl content up to 40 percent) and polyacrylamide.

Water-insoluble polymers, such as phenolic resins, epoxy resins, urea resins and melamine resins, polyvinyl acetals, polyurethanes and polysulfonyl urethanes. Printing forms giving considerably larger print-runs are obtained by using copying layers in which the polycondensates are contained in combination with polyvinylformal resins. Binder-free formulas are preferred, since they yield layers which can be developed with aqueous solutions.

Further additives:
colored pigments
dyes
plasticizers
surfactants.

All additives should be chosen such that they are compatible with the diazo-condensates and, moreover, that their absorption in the range of wavelengths which is essential for the photodecomposition of the diazonium compounds is as low as possible.

In general, the additives are employed in the following quantities:

Acids of pentavalent phosphorus are generally used in quantities between 0.01 and 4 moles per mole of diazo group. The organic polyacids are, as far as they are readily water-soluble, generally only used in quantities between 0.01 and 3 moles per mole of diazo group.

The water-soluble polymers are generally used in quantities of up to 100 parts by weight, preferably up to 20 parts by weight, per part by weight of diazopolycondensate.

The added amount of water-insoluble polymers will generally not exceed 15 parts by weight per part by weight of diazonium compound, the preferred range being 0.5 to 10 parts by weight.

If the copying layers contain water-soluble and/or water-insoluble polymers, colored or uncolored pigments are usually added in quantities of not more than 50 percent by weight, based on the weight of the polymers.

The quantities of plasticizers, dyes, surfactants, sensitizers, indicators, and fatty acids added to the copying layers are in general not higher than 20 percent by weight, preferably not more than 10 percent by weight, based on the weight of the other layer constituents.

Depending on the layer constituents, the solvents used for preparing the coating solutions may be, for example, water; alcohols, such as methanol or ethanol; glycol ethers, such as ethyleneglycol monoethyl ether; dimethyl formamide and diethylformamide.

Organic solvents which are in pure form or which contain a little water are preferably employed for clorides, bromides and salts of the novel diazocondensates, which are, to a large extent, insoluble in water, such as the salts of aromatic sulfonic acids, tetrafluoroborates, and hexafluorophosphates. In these cases, solvents in which these compounds are only slightly soluble, e.g., ethers such as dioxane and tetrahydrofuran; esters such as acetic acid ethylester, butyl acetate, and ethyleneglycol methylether acetate; ketones such as methyl ethyl ketone and cyclohexanone, and the like, are added to the alcohols or amides which, in general, are good solvents for these compounds, in order to improve the leveling properties of the coatings.

During processing, the copying material is exposed imagewise through an original. Any light source conventionally used in the copying art which emits radiation in the long-wave ultraviolet range, such as carbon arc lamps, mercury high-pressure lamps, pulsed xenon lamps, and the like, may be employed for the imagewise exposure. Electron and laser irradiation may also be used for recording images.

After exposure, developing is carried out by means of a suitable developer. Water and aqueous solutions of surfactants, optionally containing an alkali admixture; mixtures thereof with organic solvents; aqueous salt solutions; aqueous acid solutions, e.g., solutions of phosphoric acids, which in turn, may contain salts or organic solvents; and aqueous-alkaline developers, e.g., aqueous solutions of sodium salts of phosphoric acid or silicic acid, can be employed as developers. Organic solvents may also be added to these developers. In some cases it is also possible to use organic solvents which have been diluted with water. Further constituents such as surfactants and hydrophilizing agents may also be contained in the developers.

Developing is carried out in the conventional manner, e.g., by dipping the plate into the developer liquid and/or wiping or spraying the developer liquid over the plate. In the process, the unexposed layer areas are removed.

The following examples illustrate the production of the novel diazo-polycondensates and of the recording materials prepared therewith according to the present invention. In addition to the result of the elementary analysis, the atomic ratio calculated from these analysis values is given in a number of examples to characterize more precisely the diazo-condensates used. With certain reservations, this relative value allows conclusions concerning the ratio at which diazonium salt and co-components participate in the building up of the product. This ratio has been calculated on somewhat simplified assumptions, i.e., these data cannot be, nor are they intended to be, indications of the precise structure of the condensates according to the invention.

They are, however, sufficient for identifying condensation products, the properties of which are reproducible.

As mentioned above, the conditions of condensation, and particularly also the quantitative ratios used, are frequently of importance for a further characterization. In the examples, all data are contained which are required for the production of the condensates.

In the examples, parts by weight (p.b.w.) and parts by volume (p.b.v.) are related as are grams and milliliters. Unless otherwise stated, percentages are expressed in terms of weight, and temperatures are indicated in °C. In the analysis values, N denotes the total nitrogen content.

In the examples, the term "crude condensate" generally denotes the crude condensation mixture obtained in the condensation, which normally still contains the condensation medium.

EXAMPLE OF PREPARATION 1

29.2 p.b.w. of diphenylamine-4-diazonium sulfate were dissolved in 170 p.b.w. of a 90% strength methanesulfonic acid. 12.2 p.b.w. of 4-methyl-benzyl alcohol were metered into this mixture, which was then condensed for 2 hours at 40° C. 16.6 p.b.w. of 1,4-bis-methoxymethyl benzene were then added, followed by condensing for another 2 hours at 40° C. The crude condensate was dissolved in 5,000 p.b.v. of water and thereafter converted into its water-insoluble form by means of sodium mesitylenesulfonate. 35 p.b.w. of condensate were obtained.

(C: 71.5%; N: 6.5%; S: 5.2%; C:N:S=38.5:3:1.05).

EXAMPLE OF PREPARATION 2

32.4 p.b.w. of 3-methoxy-diphenylamine-4-diazonium sulfate were dissolved in 170 p.b.w. of an 85% strength phosphoric acid. 22.8 p.b.w. of 4-methyl-4'-methoxymethyl-diphenyl-ether were added dropwise to this solution, which was then condensed for 2 hours at 40° C. Then 25.8 p.b.w. of 4,4'-bis-methoxy-methyl-diphenylether were added to the mixture, followed by condensing for another 27 hours at 40° C. The crude condensate was dissolved in 5,000 p.b.v. of water. Separation of the condensate was effected by adding 500 p.b.v. of a saturated sodium chloride solution. The chloride of the condensate was dissolved in 800 p.b.v. of water and from this solution the methane-sulfonate was precipitated by the addition of 300 p.b.v. of a saturated sodium methanesulfonate solution. After filtering off by suction, the precipitate was dissolved in 800 p.b.v. of water and was again precipitated by the addition of 300 p.b.v. of a saturated sodium methanesulfonate solution. 59 p.b.w. of condensate were obtained.

(C: 65%; N: 5.0%; S: 5.8%; C:N:S=45.5:3:1.52).

EXAMPLE OF PREPARATION 3

32.2 p.b.w. of 3-methoxy-diphenylamine-4-diazonium sulfate were dissolved in 170 p.b.w. of an 85% strength phosphoric acid, 22.8 p.b.w. of 4-methyl-4'-methoxymethyl-diphenylether were added dropwise to this solution, and the mixture was then condensed for 2 hours at 40° C. Then 25.8 p.b.w. of 4,4'-bis-methoxymethyl-diphenylether were added to the condensate, followed by condensing for 27 hours at 40° C. The crude condensate was dissolved in 5,000 p.b.v. of water and was converted into a water-insoluble form by means of sodium naphthalene-2-sulfonate. 76.5 p.b.w. of condensate were obtained, which displayed excellent solubility in ethylene glycol monomethyl ether.

(C: 70.5%; N: 4.7%; S: 3.6%; $OCH_3$:4.4%; C:N:S:$OCH_3$=52.5:3:1:1.2).

EXAMPLES OF PREPARATION 4 TO 15

The following diazo-polycondensates were prepared according to the same method and using the same molecular ratio of the starting materials:

| Example | Reaction Medium | Diazonium Compound | Compound II | Reaction Time (hours) | Compound III | Reaction Time (hours) | Precipitation Form |
|---|---|---|---|---|---|---|---|
| 4 | I | M | 4-methyl-benzyl alcohol | 2 | 4,4'-bis-methoxymethyl-diphenylether | 15 | mesitylene-sulfonate |
| 5 | I | M | 4-isopropyl-benzyl alcohol | 2 | 4,4'-bis-methoxymethyl-diphenylether | 24 | mesitylene-sulfonate |
| 6 | I | M | benzyl alcohol | 2 | 4,4'-bis-methoxymethyl-diphenylether | 16 | mesitylene-sulfonate |
| 7 | I | M | 4-carboxy-benzyl alcohol | 2 | 4,4'-bis-methoxymethyl-diphenylether | 16 | mesitylene-sulfonate |
| 8 | I | M | 4-methoxy-benzyl alcohol | 2 | 4,4'-bis-methoxymethyl-diphenylether | 15 | mesitylene sulfonate |
| 9 | I | M | 4-trifluoromethylbenzyl | 2 | 4,4'-bis-methoxymethyl-di- | 16 | mesitylene-sulfonate |

| | | | | -continued | | | |
|---|---|---|---|---|---|---|---|
| 10 | I | M | alcohol<br>4-fluoro-<br>benzyl alcohol | 2 | phenylether<br>4,4'-bis-meth-<br>oxymethyl-di-<br>phenylether | 21 | mesitylene-<br>sulfonate |
| 11 | I | D | 4-methyl-4'-<br>methoxymethyl-<br>diphenylether | 2 | N,N'—dimethylol<br>urea | 18 | naphthalene-<br>2-sulfonate |
| 12 | II | M | 4-methyl-<br>benzyl alcohol | 2 | N,N'—dimethylol<br>urea | 5 | naphthalene-<br>2-sulfonate |
| 13 | I | M | 4-methyl-4'-<br>methoxymethyl<br>diphenylether | 2 | 2,6-dimethylol-<br>p-cresol | 6 | mesitylene-<br>sulfonate |
| 14 | I | M | 4-methoxy-<br>benzyl alcohol | 2 | 4,6-bis-meth-<br>oxymethyl-<br>1,3-xylene | 5 | mesitylene-<br>sulfonate |
| 15 | I | M | 4-methyl-4'-<br>methoxymethyl<br>diphenylether | 2 | 4,4'-bis-meth-<br>oxymethyl-<br>diphenyl | 26 | mesitylene-<br>sulfonate |

| Condensate of Example | Elementary Analysis (%) | | | | | Atomic Ratio | |
|---|---|---|---|---|---|---|---|
| 4 | C 70.5 | N 5.1 | S 4.1 | | | C:N:S | 49:3:1.07 |
| 5 | C 69.9 | N 5.0 | S 3.7 | | | C:N:S | 48:3:0.97 |
| 6 | C 69.2 | N 5.6 | S 4.3 | | | C:N:S | 43:3:1 |
| 7 | C 68.0 | N 5.8 | S 4.3 | | | C:N:S | 4:3:0.97 |
| 8 | C 69.2 | N 5.1 | S 4.1 | | | C:N:S | 48:3:1.05 |
| 9 | C 64.9 | N 5.2 | S 4.4 | F 6.3 | | C:N:S:F | 44:3:1.1:2.7 |
| 10 | C 68.1 | N 5.4 | S 4.2 | F 1.9 | | C:N:S:F | 44:3:1:0.8 |
| 11 | C 67.2 | N 8.7 | S 4.5 | | | C:N:S | 45:5:1.1 |
| 12 | C 67.7 | N 8.3 | S 4.5 | | | C:N:S | 48:5:1.2 |
| 13 | C 70.0 | N 5.4 | S 4.4 | | | C:N:S | 45:3:1.07 |
| 14 | C 68.6 | N 5.7 | S 4.6 | | | C:N:S | 40:3:1 |
| 15 | C 72.3 | N 4.9 | S 3.8 | | | C:N:S | 52:3:1 |

EXAMPLE OF APPLICATION 16

The condensates prepared in Examples 1 to 15 were applied to aluminum supports which had been electrolytically roughened and pre-treated with polyvinyl phosphonic acid. The coatings were then dried with warm air. The coating solutions used in the coating procedure had the following compositions:
5 p.b.w. of diazo-polycondensate
0.5 p.b.w. of an 85% strength $H_3PO_4$
0.5 p.b.w. of Victoria Pure Blue FGA (C.I. 42,595)
95 p.b.w. of ethylene glycol monomethyl ether.

The plates were exposed for 30 seconds through a negative original, using a 5 kW metal halide lamp arranged at a distance of 100 cm from the vacuum copying frame. The exposed material was developed with a developer having the following composition:
15 p.b.w. of pelargonic acid
10 p.b.w. of NaOH
92 p.b.w. of a block copolymer comprisng 90% of propylene oxide and 10% of ethylene oxide
12 p.b.w. of sodium tetrapolyphosphate and
550 p.b.w. of water.

EXAMPLE OF APPLICATION 17

(Comparative Example)

32.3 p.b.w. of 3-methoxy-diphenylamine-4-diazonium sulfate were dissolved in 170 p.b.w. of an 85% strength phosphoric acid, 25.8 p.b.w. of 4,4'-bis-methoxymethyl-diphenylether were added dropwise, and the solution was condensed for 5 hours at 40° C. After diluting with 250 p.b.v. of water, the chloride was precipitated by adding 220 p.b.v. of a semiconcentrated hydrochloric acid. The chloride was dissolved in water and, by means of sodium naphthalene-2-sulfonate, the naphthalene-2-sulfonate of the diazopolycondensate was obtained in the form of a compound which was sparingly soluble in water. Yield: 53 p.b.w. (C: 67.2%, N: 6.3%, S: 4.6%, C:N:S=37.3:3:0.96). This condensate and the condensate described in Example 3 were each applied to an aluminum support, according to the formula and the prescription given in Example 16. Using a commercial step wedge, the two samples were exposed in a copying frame to give 4 solid steps and were then developed and preserved. Thereafter, the two samples were clamped onto the cylinder of an offset printing press and used for proof printing. The plate coated with the condensate of Example 3 had completely accepted ink after printing 15 sheets, whereas the plate containing the above-described condensate required 80 printed sheets before it had completely accepted ink.

EXAMPLE OF PREPARATION 18

(Comparative Example)

32.3 p.b.w. of 3-methoxy-diphenylamine-4-diazonium sulfate were dissolved in 170 p.b.w. of an 85% strength phosphoric acid, 25.8 p.b.w. of 4,4'-bis-methoxymethyl-diphenylether were added dropwise, and the solution was condensed for 2 hours at 40° C. Then 22.8 p.b.w. of 4-methyl-4'-methoxymethyl-diphenylether were added, and the mixture was condensed for another 27 hours at 40° C. Over this entire period, samples of the reaction mixture were taken at regular intervals and diluted with water. A crude condensate which dissolved in water to form a clear solution was, even at elevated temperatures, not obtained.

EXAMPLE OF PREPARATION 19

(Comparative Example)

32.3 p.b.w. of 3-methoxy-diphenylamine-4-diazonium sulfate were dissolved in 170 p.b.w. of an 85% strength phosphoric acid, a mixture of 25.8 p.b.w. of 4,4'-bis-methoxymethyl-diphenylether and 22.8 p.b.w. of 4-methyl-4'-methoxymethyl-diphenylether were added dropwise, and the solution was then condensed for 29 hours at 40° C. Over the entire condensation period, a condensation product which gave a clear solution when dissolved in water was not obtained, even if elevated temperatures were used.

EXAMPLE OF PREPARATION 20

(Comparative Example)

32.3 p.b.w. of 3-methoxy-diphenylamine-4-diazonium sulfate were dissolved in 170 p.b.w. of an 85% strength phosphoric acid, 51.6 p.b.w. of 4,4'-bis-methoxymethyl-diphenylether were added dropwise, and the solution was condensed in parallel batches for 8 hours, 15 hours, and 26 hours at 40° C. The crude condensates obtained formed clear solutions when dissolved in 5,000 p.b.v. of water. The condensates could be precipitated by adding sodium mesitylene sulfonate. Yields: between 74 and 78 p.b.w. (C: 70.7%, N: 4.6%, S: 3.7%, OCH$_3$:4.2%; C:N:S:OCH$_3$ = 54:3:1:1.2). The products were used in the coating mixture described in Example 16 and were tested for storability (100° C. test). In this test, the plates which contained the condensation product described in Example 3 showed a storability of 4 hours, while the plates which contained the above-described condensation products had storabilities of between 1 and 2 hours.

EXAMPLE OF PREPARATION 21

(Comparative Example)

32.3 p.b.w. of 3-methoxy-diphenylamine-4-diazonium sulfate were dissolved in 170 p.b.w. of an 85% strength phosphoric acid, 12.9 p.b.w. of 4,4'-bis-methoxymethyl-diphenylether were added dropwise, and the solution was condensed for 2 hours at 40° C.; then a further quantity of 38.6 p.b.w. of 4,4'-bis-methoxymethyl-diphenylether was added. Parallel batches were condensed for an additional 24 hours, 18 hours, and 6 hours, respectively, at 40° C. In each case, a crude condensate was obtained which gave a clear solution when dissolved in 5,000 p.b.v. of water. The diazo-polycondensates could be precipitated by adding sodium mesitylene sulfonate. Yields: 70 to 76 p.b.w. (C: 69.9%, N: 4.7%, S: 4.0%, C:N:S = 52:3:1.1). It was noticeable that with decreasing condensation time, the diazo-polycondensates precipitated as the mesitylene sulfonate had a stronger tendency to become tacky. This shows that they are less suitable for industrial use. In addition, the layers prepared with these condensates had storabilities of only about 2 hours at 100° C., under the conditions according to Example 20.

EXAMPLES OF PREPARATION 22 TO 24

(a) Diazonium Compound: 3-methoxy-diphenylamine-4-diazonium sulfate
(b) Compound II: 4-carboxy-benzyl alcohol
(c) Compound III: 4,4'-bis-methoxymethyl-diphenyl-ether

| Example | 22 | 23 | 24 |
|---|---|---|---|
| Molecular Ratio a:b:c | 1:0.25:1 | 1:0.75:1 | 1:1:1 |
| p.b.w. a:b:c | 32.3:3.8:25.7 | 32.3:11.4:25.8 | 32.3:15.2:25.7 |
| Yield | 50 Gt | 55 Gt | 56 Gt |
| Analysis | C 67.2; N 6.0; S 4.7 | C 67.6; N 5.9; S 4.4 | C 68.0; N 5.8; S 4.3 |
| Atomic Ratio | C:N:S 39.4:3:1.03 | C:N:S 41:3:0.98 | C:N:S 42:3:0.98 |

The diazonium compound was dissolved in 170 p.b.w. of an 85% strength phosphoric acid, 4-carboxy-benzyl alcohol was added dropwise, and the solution was condensed for 2 hours at 40° C., after which 4,4'-bis-methoxymethyl diphenylether was added and the mixture was again condensed for 16 hours at 40° C. The crude condensate was poured into 5,000 p.b.v. of water, where it dissolved without leaving a residue. The condensate was precipitated as the chloride by adding 220 p.b.v. of semiconcentrated hydrochloric acid (1:1) and, after suction filtration, it was again dissolved in 500 p.b.v. of water. By means of sodium mesitylene sulfonate, the condensate could be precipitated as a water-insoluble compound.

Upon proof printing, the plates prepared with the above-described condensates displayed an increasing ink receptivity from Example 22 towards Example 24.

| Example | Number of printed sheets until the printing form has completely accepted ink |
|---|---|
| 22 | 60 to 70 |
| 23 | 30 to 40 |
| 24 | 15 to 20 |

EXAMPLE OF APPLICATION 25

The condensates described in Examples 4 to 15 were combined with the following solvent-soluble resins to form coating mixtures:

Polyvinyl butyral containing 69 to 71% of vinyl butyral units, 1% of vinyl acetate units, and 24 to 27% of vinyl alcohol units; viscosity of a 60% strength solution in methanol at 20° C.: 4 to 6 mPa.s (DIN 53015). Non-plasticized urea resin of the approximate acid number 2.

The coating mixtures had the following compositions:

1 p.b.w. of condensation product
0.1 p.b.w. of an 85% strength phosphoric acid
3 p.b.w. of resin
0.4 p.b.w. of Victoria Pure Blue FGA
77 p.b.w. of ethylene glycol monomethyl ether.

The mixtures were coated onto electrolytically roughened and anodically oxidized aluminum sheets. After drying, the plates thus obtained were imagewise exposed for 40 seconds under a negative original, using a metal halide lamp at 5 kW, arranged at a distance of 1 m, and were then converted into printing forms by wiping over with a developer of the following composition:

50 p.b.w. of water
15 p.b.w. of isopropanol
20 p.b.w. of n-propanol
12.5 p.b.w. of n-propylacetate
1.5 p.b.w. of polyacrylic acid
1.5 p.b.w. of acetic acid.

The resulting printing forms, in particular those containing polyvinyl butyral as the binder, exhibited an excellent print-run stability.

EXAMPLE OF APPLICATION 26

A thin copper foil was laminated to a synthetic resin plate. The copper surface of the foil was cleaned with a scouring agent and rinsed with acetone. The plate was then coated with the following solution:
1.0 p.b.w. of the polycondensate described in Example 2;
3.0 p.b.w. of a cresol formaldehyde novolac having a softening range from 105 to 120° C., according to DIN 53181;
40 p.b.w. of ethylene glycol monomethyl ether; and
0.05 p.b.w. of crystal violet.

The coating was adjusted to a layer weight of 2 g/m². Using a 5 kW metal halide lamp arranged at a distance of 100 cm from the vacuum copying frame, the plate was exposed for 2 minutes under a positive original representing a circuit diagram. For developing, a developer of the following composition was used:
3 p.b.w. of NaOH,
3 p.b.w. of sodium metasilicate.12H$_2$O,
4 p.b.w. of ethylene glycol monobutyl ether, and
90 p.b.w. of water.

Upon developing, the exposed layer areas were removed. A printed circuit was obtained by etching the copper in the bared areas with a 40% strength aqueous iron-III-chloride solution.

EXAMPLE OF APPLICATION 27

The polycondensate prepared in Example 2 could be used for the production of a screen printing form. For this purpose, 100 p.b.w. of a screen printing emulsion composed of 3 p.b.w. of a 53% strength dispersion of a vinyl acetate/maleic acid ester copolymer and 2 p.b.w. of a 24% strength solution of a polyvinyl alcohol having a K value of 75 and a content of residual acetyl groups of about 12%, was admixed with a solution of 0.7 p.b.w. of the polycondensate described in Example 2 in 12 p.b.v. of water. The dispersion was dyed with 5 p.b.v. of a 5% strength solution of crystal violet. It was then used to coat a polyester screen printing fabric in the usual manner, and was then dried, exposed, developed with water, and again dried. The layer which was present on the fabric showed a very good resolution and sensitivity to light.

What is claimed is:

1. A light-sensitive, diazonium group-containing polycondensation product of a process comprising the steps of (i) condensing about 1 mole of a diazonium salt corresponding to formula I

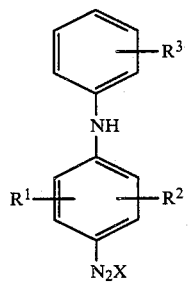

(I)

wherein
R$^1$, R$^2$, and R$^3$ each denote separately a hydrogen atom, an alkyl group having from 1 to 3 carbon atoms, or an alkoxy group having from 1 to 6 carbon atoms, and
X denotes the anion of the diazonium salt;
in a strongly acidic medium with about 0.1 to 1.5 moles of a compound corresponding to the formula II

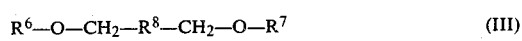

wherein
R$^4$ denotes a hydrogen atom, an alkyl group or an aliphatic acyl radical and
R$^5$ denotes a mononuclear or polynuclear aromatic radical, which is unsubstituted or is substituted by at least one halogen atom, alkyl group, halogenated alkyl group, alkoxy group having from 1 to 3 carbon atoms, carboxy group, aryl group, arylmercapto group, or aryloxy group,
each of said diazonium salt I and said compound II being present in an amount sufficient to produce a first reaction product, and (ii) then reacting said first reaction product in a strongly acid medium with about 0.5 to 1.5 moles of a compound corresponding to formula III $$R^6-O-CH_2-R^8-CH_2-O-R^7 \quad (III)$$

wherein
R$^6$ and R$^7$ each denote separately a hydrogen atom, an alkyl group, or an aliphatic acyl radical, and
R$^8$ denotes the radical of a compound selected from the group consisting of aromatic hydrocarbons, phenols, phenolethers, aromatic thioethers, aromatic heterocyclic compounds, and organic acid amides,
such that the radicals resulting from compound II are directly linked to the units of said diazonium salt I, each of said first reaction product and said compound III being present in an amount sufficient to produce said light-sensitive polycondensation product.

2. A polycondensation product as claimed in claim 1, wherein R$^4$, R$^6$, and R$^7$ each denote a hydrogen atom or a methyl group.

3. A polycondensation product as claimed in claim 1, wherein R$^8$ comprises a radical having (a) one aromatic ring or (b) two aromatic rings which are linked by a single bond or by —O—, —NH—, —CH$_2$— or —S—.

4. A polycondensation product as claimed in claim 1, wherein said diazonium salt comprises a diphenylamine-4-diazonium salt which is unsubstituted or is substituted by an alkyl or an alkoxy group having from 1 to 3 carbon atoms.

5. A polycondensation product as claimed in claim 4, wherein said diazonium salt is derived from 4-aminodiphenylamine, 3-methyl-4-aminodiphenylamine, or 3-methoxy-4-aminodiphenylamine.

6. A light-sensitive recording material comprising a support and a light-sensitive layer containing as the light-sensitive compound a diazonium-salt polycondensation product as claimed in claim 1.

7. A polycondensation product as claimed in claim 1, wherein step (i) comprises condensing about 1 mole of a diazonium salt corresponding to formula I in a strongly acidic medium with about 0.25 to 1.5 moles of a compound corresponding to formula II.

8. A polycondensation product as claimed in claim 1, wherein about 0.25 and 1.5 moles of said compound corresponding to formula II is reacted with about 1 mole of said diazonium salt in step (i).

9. A polycondensation product as claimed in claim 1, wherein about 0.5 and 1.5 moles of said compound corresponding to formula II is reacted with about 1 mole of said diazonium salt in step (i).

10. A process for the production of a light-sensitive, diazonium group-containing polycondensation product, comprising the steps of:

(a) condensing about 1 mole of a diazonium salt corresponding to formula I

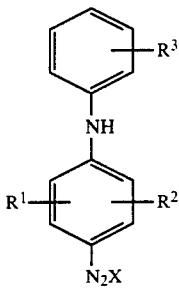

wherein
$R^1$, $R^2$, and $R^3$ each denote separately a hydrogen atom, a halogen atom, an alkyl group having from 1 to 3 carbon atoms, or an alkoxy group having from 1 to 6 carbon atoms, and
X denotes the anion of the diazonium salt,
in a strongly acid medium with about 0.1 to 1.5 moles of a compound corresponding to formula II $$R^4\!-\!O\!-\!CH_2\!-\!R^5 \quad (II)$$

wherein
$R^4$ denotes a hydrogen atom, an alkyl group or an aliphatic acyl radical and
$R^5$ denotes a mononuclear or polynuclear aromatic radical, which is unsubstituted or is substituted by at least one halogen atom, alkyl group, halogenated alkyl group, alkoxy group having from 1 to 3 carbon atoms, carboxy group, aryl group, arylmercapto group, or aryloxy group,
to produce a first reaction product; and thereafter
(b) reacting said first reaction product with about 0.5 to 1.5 moles of a compound corresponding to formula III $$R^6\!-\!O\!-\!CH_2\!-\!R^8\!-\!CH_2\!-\!O\!-\!R^7 \quad (III)$$

wherein
$R^6$ and $R^7$ each denote separately a hydrogen atom, an alkyl group, or an aliphatic acyl radical, and
$R^8$ denotes the radical of a compound selected from the group consisting of aromatic hydrocarbons, phenols, phenolethers, aromatic thioethers, aromatic heterocyclic compounds, and organic acid amides,
in amounts sufficient to produce said light-sensitive polycondensation product, such that the radicals resulting from compound II are directly linked to the units of said diazonium salt I.

* * * * *